United States Patent [19]

Francis

[11] 4,420,815
[45] Dec. 13, 1983

[54] APPARATUS AND METHOD FOR REMOVAL OF SINUSOIDAL NOISE FROM A SAMPLED SIGNAL

[75] Inventor: David B. Francis, Mount Kisco, N.Y.

[73] Assignee: International Business Machines Corporation, Armonk, N.Y.

[21] Appl. No.: 264,510

[22] Filed: May 18, 1981

[51] Int. Cl.³ ............................................. G06F 15/31
[52] U.S. Cl. ................................................... 364/724
[58] Field of Search .............. 364/724, 825; 343/5 DP

[56] References Cited

U.S. PATENT DOCUMENTS

| | | | |
|---|---|---|---|
| 3,780,279 | 12/1973 | Stover | 364/724 |
| 3,894,219 | 7/1975 | Weigel | 343/5 DP X |
| 4,344,150 | 8/1982 | McLaughlin | 364/724 |

OTHER PUBLICATIONS

"Adaptive Noise Cancelling: Principles and Applications" by Widrow et al, Proceedings of the IEEE, vol. 23, No. 12, Dec. 1975, p. 1692.
"Digital Filters for ECG Signals" by D. W. Mortara, Computers in Cardiology, Sep. 29–Oct. 1, 1977, Rotterdam The Netherlands, p. 511.
"Device for Removal of Sinusoidal Noise from Sampled Signal" by D. B. Francis, IBM Technical Disclosure Bulletin, vol. 23, No. 7B, Dec. 1980, p. 3405.

Primary Examiner—David H. Malzahn
Attorney, Agent, or Firm—Thomas J. Kilgannon

[57] ABSTRACT

An apparatus and method for removing signal frequency sinusoidal noise from an analog signal is disclosed. The filter apparatus utilizes A Programmable Gain Amplifier (PGA) as an input to a discrete sine wave generator to control the amplitude and phase of the discrete sine wave generator. The output of the latter, after being full live rectified, controls the gain of the PGA so that its output, when appropriately phase shifted, cancels sinusoidal noise from a sampled analog signal. The apparatus is particularly adapted to cancelling 60 cycle noise from electrocardiogram (ECG) signals. The filtering approach can be implemented on a programmed general purpose digital computer and the method steps for achieving filtering of single frequency noise from an analog signal are disclosed.

19 Claims, 9 Drawing Figures

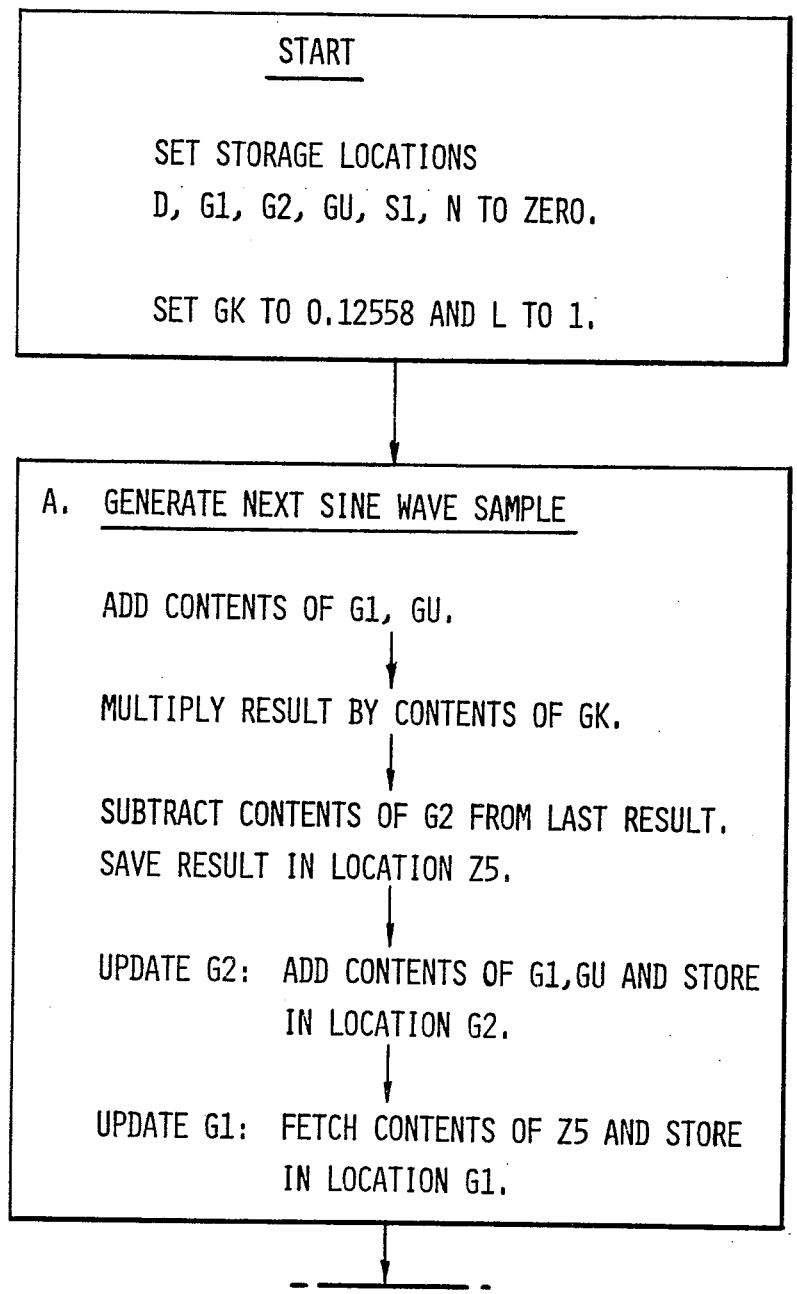
FIG. 4.1 FLOW CHART FOR REMOVAL OF 60 CYCLE NOISE FROM ECG SIGNAL.

FIG. 4.2
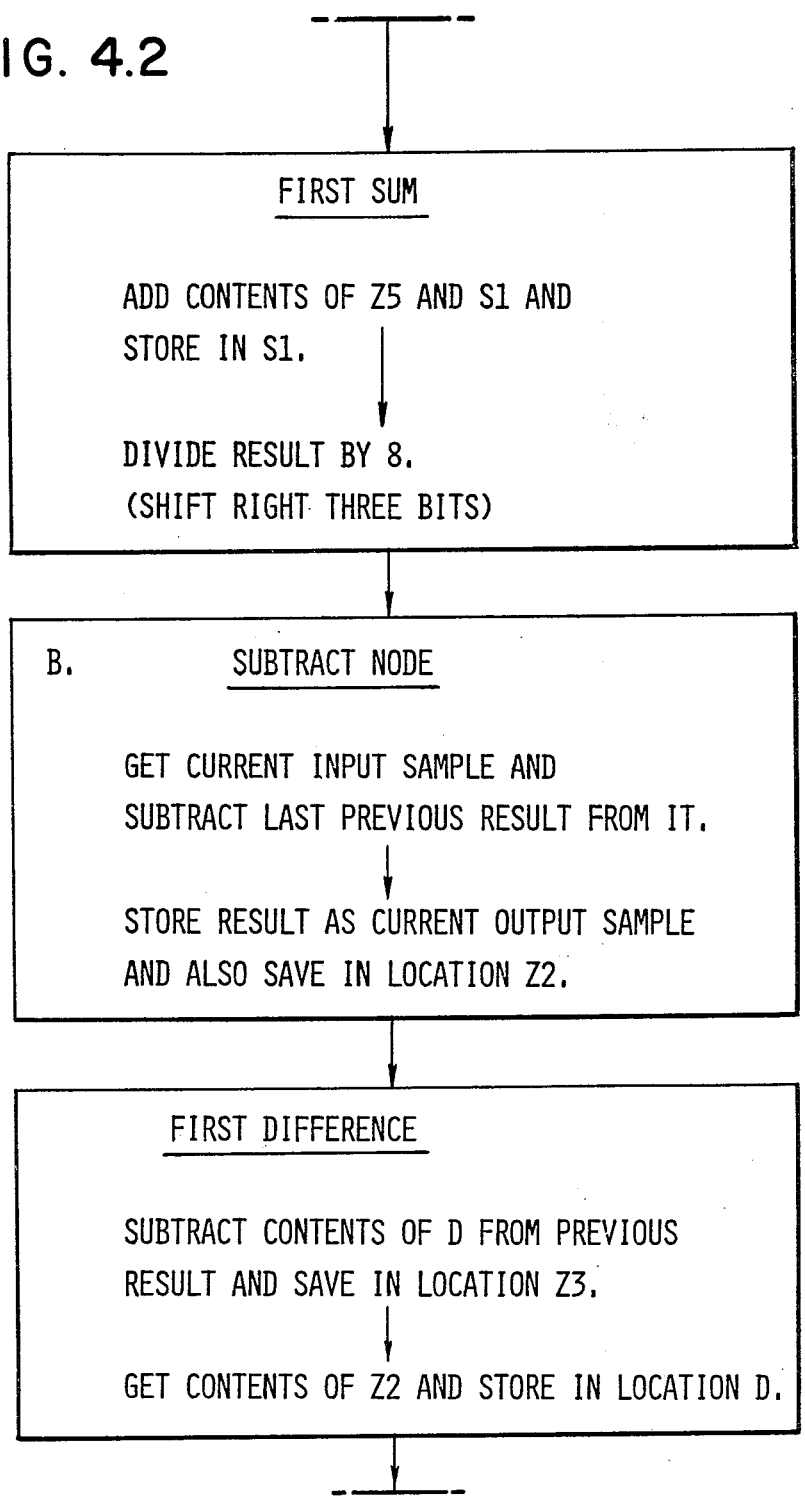

FIG. 4.3
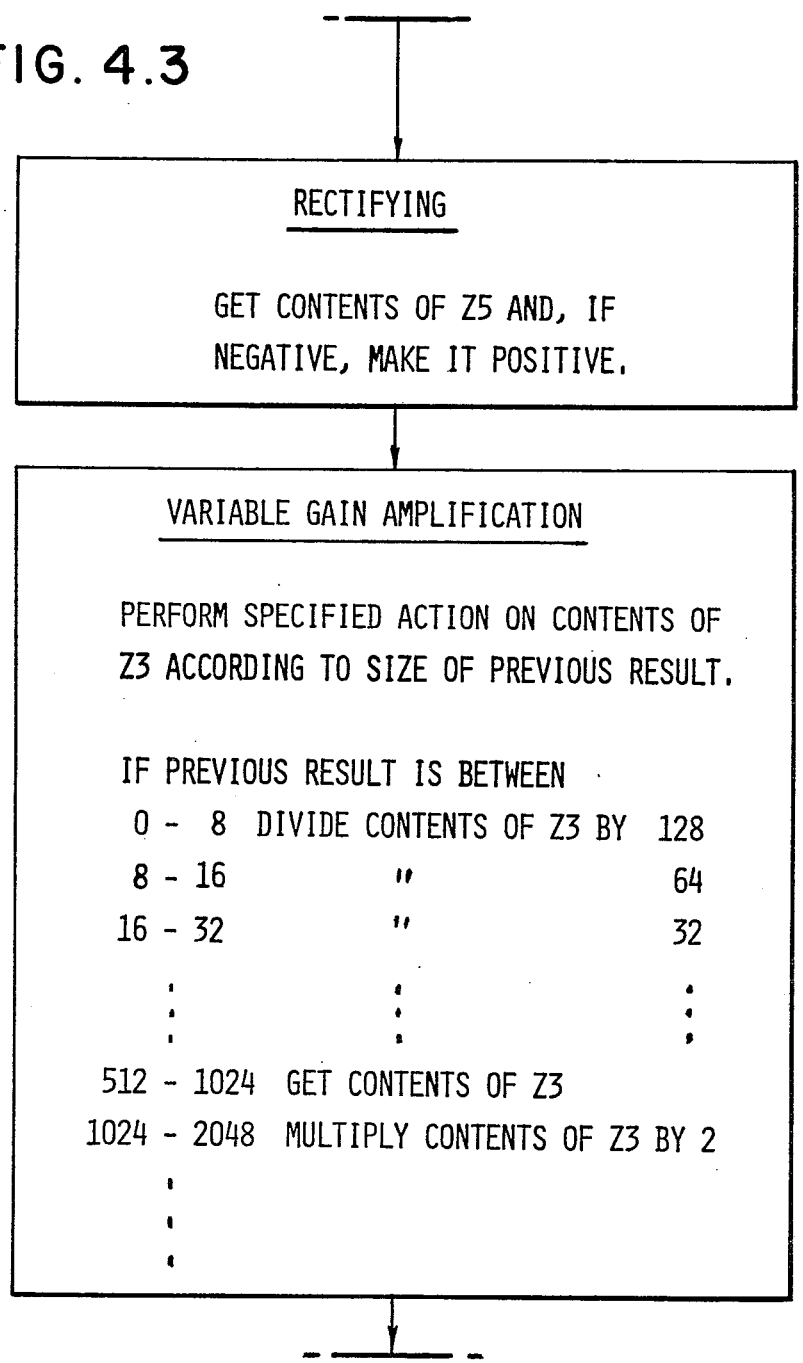

FIG. 4.4
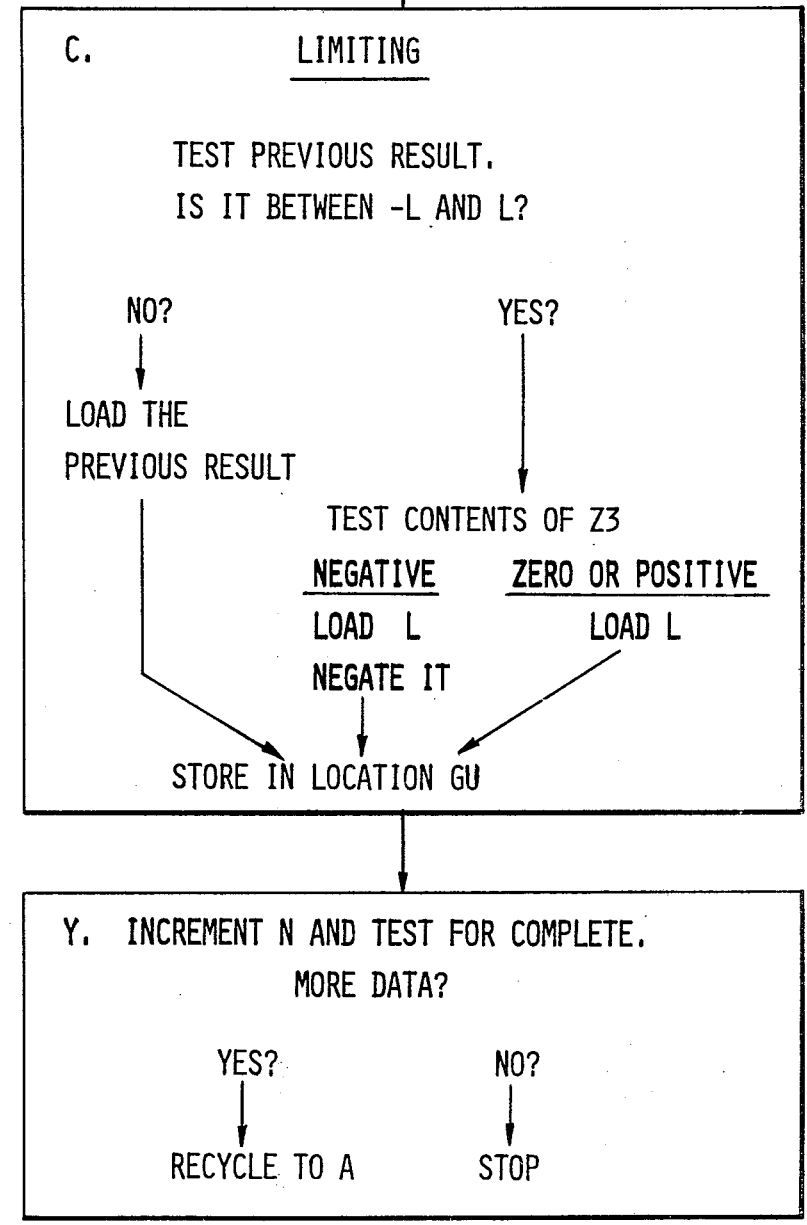

FIG. 5.1 FLOW CHART FOR FILTER TRAINING PROCEDURE
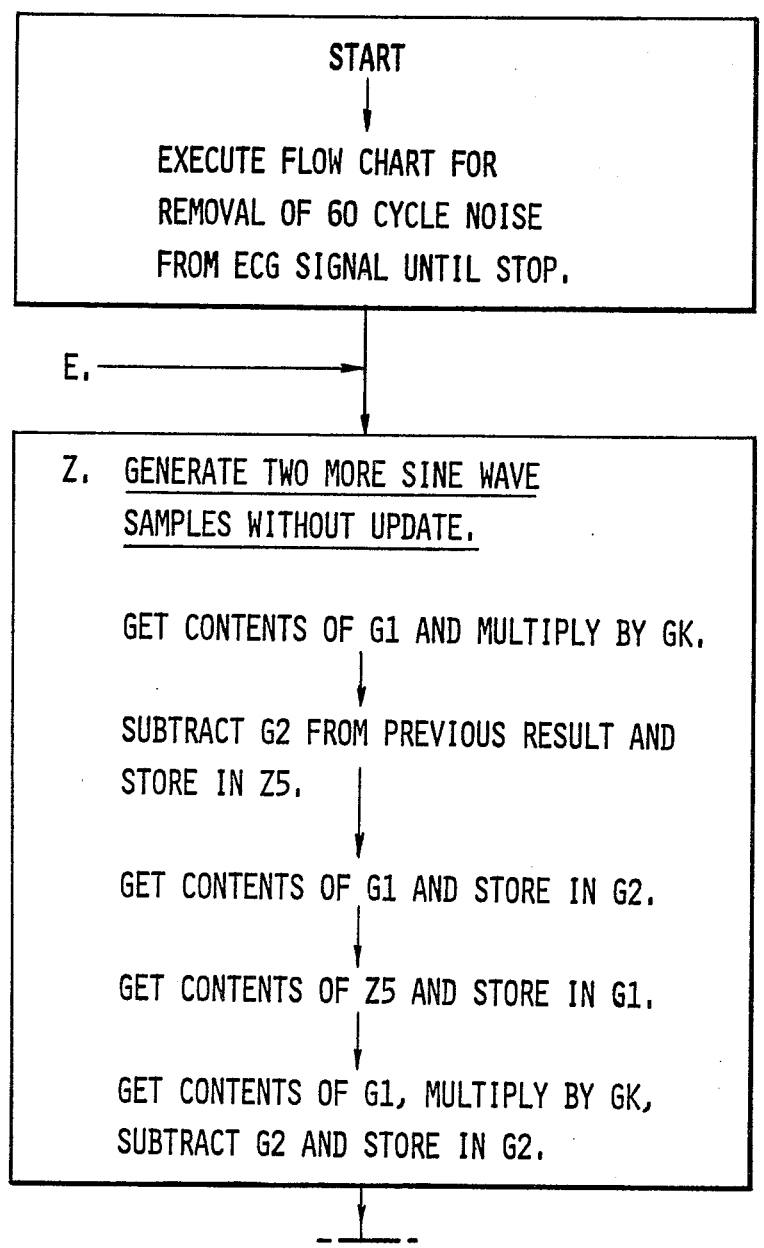

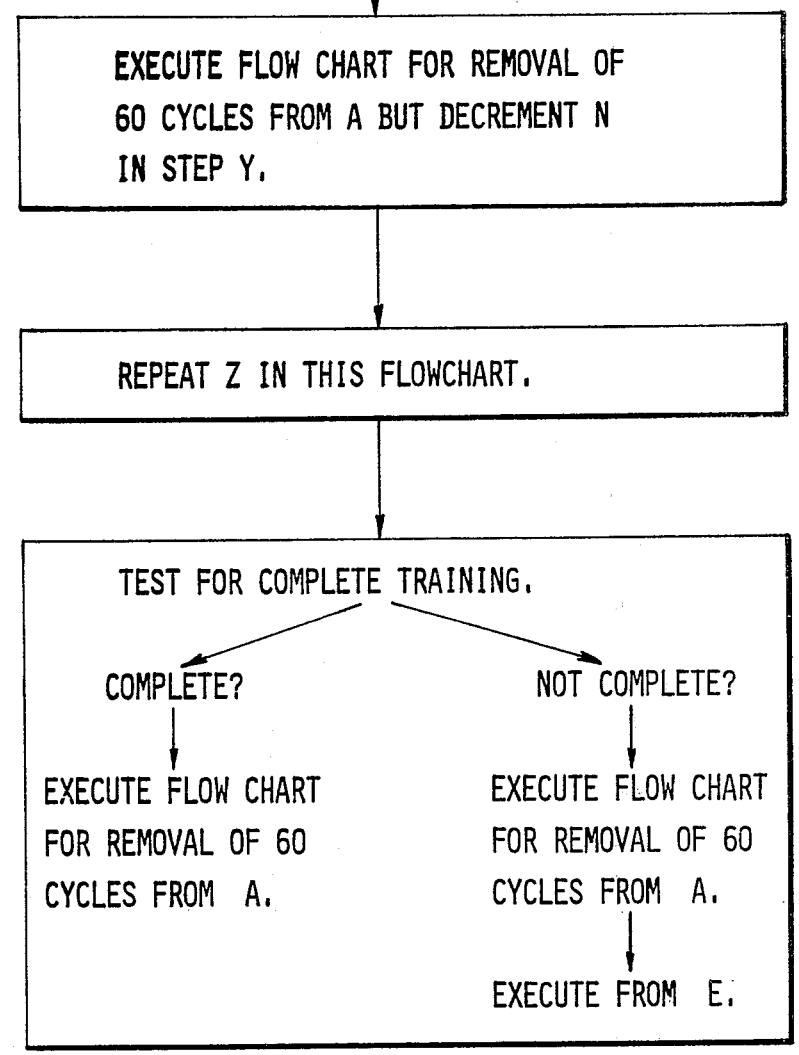
FIG. 5.2

APPARATUS AND METHOD FOR REMOVAL OF SINUSOIDAL NOISE FROM A SAMPLED SIGNAL

DESCRIPTION

1. Technical Field

This invention relates to digital filters and more particularly relates to apparatus and method for removing sinusoidal noise from an analog signal. Still more particularly it relates to apparatus which utilizes a Programmable Gain Amplifier (PGA) as an input to a discrete sine wave generator to control the amplitude and phase of its output. The output of the latter, after being full wave rectified, controls the gain of the PGA so that its output, when appropriately phase shifted, cancels sinusoidal noise from a sampled analog signal. The apparatus is particularly adapted to cancelling 60 cycle noise from electrocardiogram (ECG) signals. The filtering approach can be implemented on a programmed general purpose digital computer.

2. Background Art

Signal processing of any kind always seeks to eliminate spurious signals or noise from the desired signal so that the output of a circuit which processes the signal is a true representation of the input signal without noise. This is particularly so in the processing of electrocardiographic signals where the shape of the analog wave provides information which is critical to the treatment of a patient.

A major noise component in the electrocardiogram is power source noise at the power frequency of 60 cycles/second.

Some early work in cancelling 60 Hz interference in electrocardiography is shown in an article entitled: "Adaptive Noise Cancelling: Principles and Applications" by Widrow et al, Proceedings of the IEEE, Vol. 63, No. 12, December 1975, p. 1692. The article deals specifically with the subject of cancelling 60 Hz interference at p 1701 in conjunction with FIG. 10 of the article. While the approach taught in the article provides for satisfactory filtering of an electrocardiographic signal, it requires the use of a sine wave generator and phase shifter, a complex adaptive filtering approach and two variable coefficient multipliers which must be adjusted for each data point. This requires the multiplication of two variables on a computer with the resulting loss of speed.

Digital filtering of electrocardiographic signals is also discussed in an article entitled: "Digital Filters for ECG Signals" by D. W. Mortara, Computers in Cardiology, Sept. 29-Oct. 1, 1977, Rotterdam, The Netherlands, p. 511. The article describes the use of an adaptive filter which has a fast response. While the response is fast, a ringing or peak in the frequency response is encountered which can inject noise into the system.

In another approach described in an article entitled: "Device for Removal of Sinusoidal Noise From Sampled Signal" by D. B. Francis, IBM Technical Disclosure Bulletin, Vol. 23, No. 7B, December 1980, p. 3405, the ringing is eliminated but a spurious signal is introduced into the system when the filter encounters frequencies other than the 60 cycle signal which is to be filtered.

From the foregoing, it should be clear that while the specific problem of filtering 60 Hz from ECG signals has been addressed by the prior art and techniques have been developed to provide the desired result, these techniques are either too complex or generate undesired signals which detract from the desired result.

It is, therefore, an object of this invention to digitally remove power line signals from an ECG signal.

It is another object to provide a notch filter with an extremely narrow band-stop or notch, so that a desired signal is removed without seriously affecting the frequency content of the ECG signal.

It is still another object to provide a notch filter which avoids the need for precision analog filter elements and the attendant lengthy set-up time.

It is yet another object to provide a digital filter which is very fast and accurate.

It is still another object to provide a digital filter which can be used in conjunction with microprocessors and which avoids time consuming multiplication of variables.

BRIEF SUMMARY OF THE INVENTION

This invention relates to an apparatus and method for removing sinusoidal noise from an analog signal. Still more particularly, it relates to an apparatus and method for removing additive sinusoidal noise at a single frequency from an electrocardiographic signal. Apparatus is provided which broadly determines the amount of noise present in each sample of a sampled analog signal and, after a circuit training interval, subtracts the noise on a real time basis, from each sample providing a substantially noise-free signal at the circuit output. The circuit uses a single discrete sine wave generator. The input to the latter is obtained from a Programmable Gain Amplifier (PGA), the input to which is a sample of the circuit input signal from which frequency components lower than the frequency being filtered have been removed. The PGA provides outputs which are a function of control signals derived from the sine wave generator output. The control inputs to the PGA are samples from the output of the discrete sine wave generator which have been subjected to full wave rectification to provide only the absolute amplitude value of the samples. A limiter in the sine wave generator insures that the output of the latter never falls to zero thereby insuring a control output for the programmable gain amplifier at all times. The input to the sine wave generator is, therefore, a sample which is a function of the program of the PGA which adjusts both the amplitude and phase of the sine wave generator. The resulting output samples, when appropriately phase shifted (to eliminate the effects of the initial phase shifting of the input samples), are applied to the minus input terminal of a differential amplifier. The latter has the input signal samples containing both the desired signal and noise applied to its plus input terminal. The output from the differential amplifier is, in time, the desired signal free of single frequency noise.

Filtering, as described above, may be achieved both by the use of electrical circuitry using conventional components and by programming a general purpose digital computer. A program for carrying out the filtering of sinusoidal noise from a sampled analog signal is provided.

These and other objects, features and advantages will be more apparent from the following more particular description of the preferred embodiments.

BRIEF DESCRIPTION OF THE DRAWINGS

FIGS. 4.1-4.4 is a Flow Chart for Removal of 60 Cycle Noise From ECG Signal sampled at 250 cycles per second which illustrates the method of the present invention.

FIGS. 5.1-5.2 is a Flow Chart for Filter Training Procedure illustrating the method for training prior to filtering a noise containing signal.

DESCRIPTION OF PREFERRED EMBODIMENTS

Figure 1:
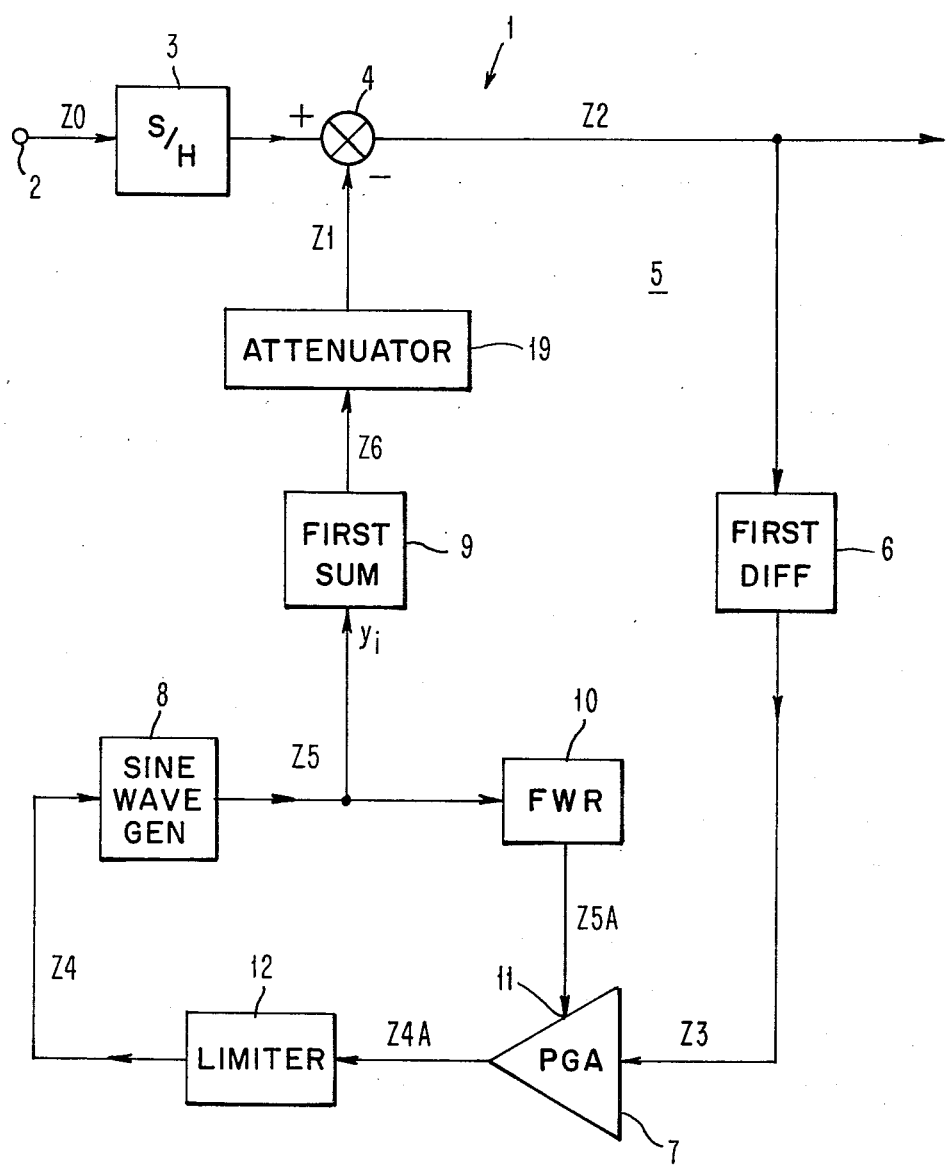
FIG. 1 is a block diagram of a digital filter circuit for filtering 60 Hz from an ECG signal showing the use of a Programmable Gain Amplifier (PGA) to control the phase and amplitude of a discrete sine wave generator. The control input to the PGA is a full wave rectified version of the output of the sine wave generator.

Referring now to FIG. 1, there is shown a specific circuit 1, in block diagram form, which achieves the removal of noise, at a specific frequency, from a signal which must be substantially free of such contamination. In FIG. 1, the various elements of the filter circuit in accordance with the teaching of the present invention, are shown and identified in the usual way. In addition, various points in the circuit are identified by the reference characters Z0–Z6 to relate these points to the information present in various storage locations mentioned in the Flow Charts of FIGS. 4.1-4.4,5.1-5.2.

In FIG. 1, a signal (Z0) containing sinusoidal noise is applied to the input terminal 2 of a Sample and Hold (S/H) circuit 3. The latter samples the noise contaminated signal providing output pulses each of which has an amplitude representative of both signal and noise at the sampling instant. The output of S/H circuit 3 is applied to one input (+) of a summing circuit 4 which may be a differential amplifier. The other input (−) of circuit 4 is a signal (Z1) which effectively cancels the noise present on the signal applied at the (+) input of circuit 4. The output (Z2) of the latter is a plurality of samples of the input signal with the noise removed. The signal applied to the (−) input of summing circuit 4 is derived from a feedback circuit 5 which includes a first difference circuit 6, a Programmable Gain Amplifier (PGA) 7, discrete sine wave generator 8 and a first sum circuit 9. Programmable gain amplifier 7 has a control input which is derived from sine wave generator 8 via a full wave rectification circuit 10.

First difference circuit 6, which may be a sample and hold circuit and a differential amplifier arranged in a well known way, removes any DC component present. The sample and hold circuit stores a sample value for one sampling interval and applies the sample during the next sampling interval to one input (−) of a differential amplifier. The unstored next sample is simultaneously applied to the other input (+) of the differential amplifier, providing an output:

$$y_i = x_i - x_{i-1}.$$

The output (Z3) of circuit 6 is applied to the input of PGA 7, where, under control of a control input 11 from Full Wave Rectifier (FWR) circuit 10, the signal from circuit 6 is subjected to a gain which may change from sample-to-sample. For the present filtering scheme, PGA 7 provides an output (Z4A) which may be as little as one one-hundredth the amplitude of the input. Thus, amplitude reduction is used so that the input to generator 8 falls within a certain range.

PGA 7 is programmed as shown in Table I and provides from a rectified input (Z5A) at input 11 and input (Z3), the output (Z4A).

TABLE I

| LOWER LIMIT | ≦ Z5A < | UPPER LIMIT | OPERATION PERFORMED | GAIN |
|---|---|---|---|---|
| 0 | | 8 | Z4A ← Z3 ÷ 128 | 1/128 |
| 8 | | 16 | Z3 ÷ 64 | 1/64 |
| 16 | | 32 | Z3 ÷ 32 | 1/32 |
| 32 | | 64 | Z3 ÷ 16 | 1/16 |
| 64 | | 128 | Z3 ÷ 8 | ⅛ |
| 128 | | 256 | Z3 ÷ 4 | ¼ |
| 256 | | 512 | Z3 ÷ 2 | ½ |
| 512 | | 1024 | Z4A ← Z3 | 1 |
| 1024 | | 2048 | Z4A ← Z3 · 2 | 2 |

The table is best implemented using shifts of the binary data.

Programmable gain amplifiers made from a pair of Harris semiconductor HA-2400 four channel programmable amplifiers may be utilized in the practice of the present invention. FIGS. 8–25, p. 435, in "IC OP-AMP COOKBOOK" By W. C. Jung, published by H. W. Sam & Co., Inc., 1974, shows such a programmable gain amplifier. The programmable gain amplifier shown utilizes a control input which is digitized. To make it compatible with the circuit of FIG. 1, an analog-to-digital converter may be utilized to convert the absolute value input (Z5A) from analog-to-digital form.

Figure 2:
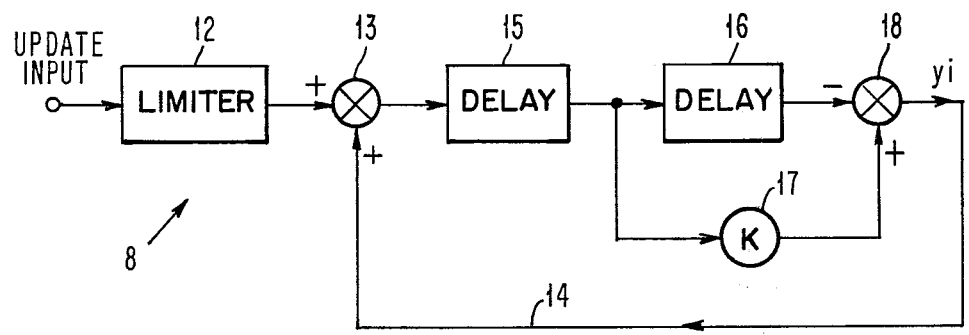
FIG. 2 is a block diagram of the discrete sine wave generator of FIG. 1 which includes a limiter which insures that the output of the generator never falls to zero.

FIG. 2 shows a block diagram of discrete sine wave generator 8. Generator 8 uses difference equations to generate samples of a fixed frequency sinusoid and can be tuned to any desired frequency. The output (Z4A) of PGA 7 of FIG. 1 characterized in FIG. 2 as Update Input is applied to a limiter 12, the output of which is applied to one input (+) of a summing circuit 13. The other input of circuit 13 is derived from a feedback loop 14. The output of summing circuit 13 is introduced into a delay circuit 15 which may be a sample and hold circuit which provides a delay of one sampling interval. The output of circuit 15 is simultaneously applied to another delay circuit 16 which provides an additional delay of one sampling interval and to a multiplier circuit 17. The frequency of generator 8 is controlled by the multiplication constant $$K = 2 \cdot \cos(2\pi FT),$$

wherein
 F is the frequency desired.
 T is the sampling interval.

The output of delay circuit 16 is fed to one input (−) of a differential amplifier 18 while the output of multiplier 17 is fed to the other input (+) of differential amplifier 18. The output of differential amplifier 18 is applied via feedback loop 14 to the other input (+) of summing circuit 13.

In FIG. 2, limiter 12 insures that its output is rarely zero. The output of limiter 13 is given by:

$$Y = \begin{cases} x & \text{for } x > L \\ x & \text{for } x < -L \\ L & \text{for } 0 \leq x \leq L \\ -L & \text{for } -L \leq x \leq 0 \end{cases}$$

Figure 3:
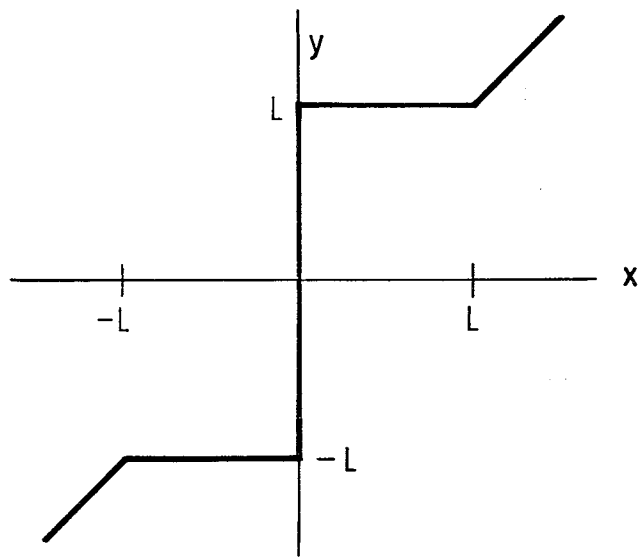
FIG. 3 is a graph of the input-output characteristic of the limiter shown in FIGS. 1,2.

FIG. 3 represents the limiter characteristic where $y=L(x)$. Limiter circuits having the characteristic may be fabricated from comparator and switching circuits in a manner well known to one skilled in the electronics art.

Generator 8 provides the output (Z5):

$$y_i = K \cdot [y_{i-1} + L(x_{i-1})] - [y_{i-2} + L(x_{i-2})]$$

Generator 8 provides samples of a sine wave which is sampled at the same rate as the input at terminal 2 is sampled by S/H circuit 3. The output $y_i$ of generator 8 is now applied to First Sum circuit 9 of FIG. 1. Circuit 9 provides a function which is the inverse of first difference circuit 6. Circuit 9 cancels the effect of the first difference circuit 6 and may be implemented in accordance with the equation:

$$y'_i = x_i + y'_{i-1}$$

using a summing amplifier to one input (+) of which is applied a sample and to the other input (+) of which is applied the previous output of the summing amplifier delayed by one sampling interval.

At the same time the output $y_i$ is applied to first sum circuit 9, this same output is applied via full wave rectifier 10 to control input 11 of PGA 7. The output of generator 8 is applied to rectifier 10 to provide signals of only one polarity. Thus, the control input is a signal having only greater or lesser magnitude. Amplifier 7 is arranged so that its gain increases when the amplitude of the control input increases. As indicated above, the output of generator 8 is applied to a limiter 12. The latter is adjusted so that its output is never nearer to zero than a specified limiting value. Limiter 12 prevents the occurrence of a deadlock situation. The Update Input (Z4) to the sine wave generator 8 acts to control the generator's amplitude and phase. When the output $y_i$ and the Update Input have the same sign, generator 8 output is increased subsequently. When the signs are opposite, the amplitude is reduced. A given amount of the update will be relatively less effective when generator 8 amplitude is high. PGA 7 acts to compensate for this loss of effectiveness. The output (Z6) of circuit 9 is applied to the other input (−) of circuit 4. The output (Z2) of the latter is a plurality of samples of the input signal substantially free of noise. Attenuator 19 in FIG. 1 is provided to remove any arbitrary gains which may have been previously introduced into the circuit.

The above described arrangements can, of course, be implemented by suitably programming a digital computer which includes an analog-to-digital converter at the input and a digital-to-analog converter at its output.

FIGS. 4.1–4.4 comprise a flow chart entitled "Removal of 60 Cycle Noise From ECG Signal" which illustrates the steps in the method of the present invention. The best mode of carrying out the teaching of the present invention is to program a general purpose digital computer where, under program control, the steps shown in FIGS. 4.1–4.4 are carried out as indicated. The Flow Charts show the treatment of a noise containing signal on a sample-by-sample basis. In FIGS. 4.1–4.4, certain symbols or reference characters are utilized to illustrate the various parameters involved in implementing the flow chart. Table II below identifies the parameters and their associated symbols.

TABLE II

GK = Sine Wave Generator Constant which for 60 Hz and 250 Samples/Sec = 0.12558
L = Limiter Constant which for Embodiment Shown = 1
D = First Difference Storage
G1 = Generator Memory, Previous Sample
G2 = Generator Memory, Second Previous Sample
GU = Generator Update Memory
S1 = First Sum Memory
N = Sample Index After the various steps are carried out on a given sample, the steps are reiterated until there is no further data. Using the steps shown, noise removal at a specific frequency of 60 Hz can be expected to occur in approximately 120 sampling intervals when the sampling frequency is 250 cps. Noise at other frequencies and different sampling rates will, of course, affect the length of time required to achieve noise removal.

The method involved includes the steps of generating input samples of an analog signal like an ECG which also contains noise at a single frequency, e.g. 60 Hz at a given sampling rate, e.g. 250 Hz; removing from the input samples components at frequencies lower than the single frequency noise; generating discrete sine wave samples at said given sampling rate; adjusting the amplitude of the samples containing the single frequency noise to provide output samples the amplitude of which is increased when the amplitude of the discrete sine wave sample is relatively large and the amplitude of which is decreased when the amplitude of the discrete sine wave samples is relatively small; generating samples having at least a minimum value when the amplitude of any of the output samples falls below a limiting value; applying a sample having at least a minimum value or an output sample to adjust the amplitude and phase of the discrete sine wave samples; compensating for the effects of the step of removing frequencies lower than the single frequency noise to provide discrete sine wave samples which have been further shifted in phase, and cancelling said noise at the single frequency from each of the plurality of input samples by subtracting a further phase shifted discrete sine wave sample from an input sample.

The method involved further includes the step of generating from said discrete output samples control samples which modify the output samples so that they are directly related to the absolute value of the control samples.

Other more specific steps such as phase shifting, delaying, amplifying and rectifying are included in the method which permits the removal of single frequency noise from an analog signal without adversely affecting the frequency content of the analog signal.

FIGS. 5.1–5.2 comprise a flow chart entitled "Filter Training Procedure" which illustrates the steps utilized in setting-up a computer to carry out the filtering method shown in the flow chart of FIGS. 4.1–4.4.

Training is necessary because it is desired to filter only a single frequency. When a signal with associated noise is presented to the filter, a period of time must elapse before noise removal is complete.

This is a minor problem if data can be continuously applied to the filter. Where, however, it is necessary to filter short segments of prerecorded data, the training time may be long compared to the time span of the recorded data. To overcome this problem, the filter is trained by the repeated application of the same data to the filter input. To insure that phase synchronism is preserved, the data is applied to the filter in a forward direction, and, when the end of the segment is reached, a reversal procedure is performed. The reversal procedure alters the values held in the filter delay circuits so that the data may now be applied in reverse order without loss of phase continuity. Data is applied in reverse order until the beginning of the data is reached, whereupon the reversal procedure is again performed. This reversal procedure is carried out a sufficient number of times to achieve satisfactory filtering. During training, the stored data is not modified and the outputs are discarded.

The following is source code program written in PL/I which may be invoked as a subroutine by a suitable main program which obtains the digitized samples and arranges them in storage. The subroutine can be executed on an IBM 370/168. The program provided carries out both the filtering and training functions.

```
FILTER: /*MAIN ENTRY POINT*/
    PROCEDURE (XFAKE,NOPTS,OLDA,OLDERA,OLDX,DUMMY,AMAX);

/*      COHERENT FILTER ALGORITHM

VERSION FOR 60 HZ. WITH PHASE SHIFTER

REMOVES SINUSOIDAL NOISE FROM SIGNAL IN NARROW
        BAND ABOUT A CENTER FREQUENCY. DESIGNED TO
        ALLOW USE ON DATA WHICH IS AVAILABLE IN BLOCKS,
        I.E.: ⅓ LEADSET AT A TIME. ALGORITHM IS
        ADAPTIVE, ESTIMATING THE AMPLITUDE AND PHASE
        OF THE NOISE, THEN REMOVING IT. THUS A
        TRAINING INTERVAL IS REQUIRED BEFORE NOISE IS
        ACTUALLY REMOVED. THE CONVERGENCE IS FAIRLY
        RAPID.

CALL FILTER (XDATA,NOPTS,OLDA,OLDERA,OLDX,DUMMY,
        AMAX).

CALLING PARAMETERS:

XDATA - THE INPUT DATA ARRANGED IN X1,Y1,Z1,X2,
                Y2, Z2, ...
                FORMAT. THE ROUTINE INDEXES BY 3 TO FILTER
                ANY OF THE LEADS DEPENDING ON WHERE IT IS
                STARTED.
        NOPTS - THE NUMBER OF SAMPLE POINTS TO FILTER.
        OLDA,OLDERA - TO MAINTAIN CONTINUITY WHEN USED
                ON BLOCKED DATA. INITIALIZE TO ZERO ON
                FIRST CALL FOR A LEAD.
        OLDX - TO MAINTAIN CONTINUITY WHEN USED ON
                BLOCKED DATA. INITIALIZE TO THE VALUE OF
                THE FIRST SAMPLE POINT ON THE FIRST CALL
                FOR A LEAD.
        AMAX - THE PEAK VALUE OF THE NOISE REMOVED.
                INITIALIZE TO ZERO AT AN APPROPRIATE POINT
                DEPENDING ON WHETHER IT IS DESIRED TO READ
                THE PEAK NOISE FOR A LEAD,LEADSET, OR ECG.
        DUMMY - NOT USED IN THIS VERSION.

AUXILIARY ENTRY POINT TO TRAIN THE ROUTINE:
                TRAIN. MAKES A PASS OVER THE DATA FORWARD,
                THEN REVERSES TO RETURN OVER THE DATA
                BACKWARDS. SETS VALUES OF OLDA AND OLDERA
                READY FOR USE WHEN INVOKING MAIN ENTRY
                POINT: FILTER.

CALL TRAIN (XDATA,NOPTS,OLDA,OLDERA,OLDX,DUMMY,
                AMAXF,AMAXB)

ADDITIONAL PARAMETERS:

AMAXF, AMAXB - READ PEAK AMPLITUDE OF NOISE ON
                THE FORWARD AND BACKWARD PASSES RESPECTIVELY.
                CAN BE USED FOR TESTING WHETHER THE TRAINING
                IS COMPLETE.*/
        DCL    (OLDA,OLDERA,NOPTS,AMAX,DUMMY,OLDX)
                FIXED BINARY (15);
        DCL    (I,J,F,A,B) FIXED BINARY (15);
        DCL    XDATA(424) FIXED BINARY(15) BASED (XPTR);
        DCL    XFAKE FIXED BINARY (15),XPTR POINTER;
        DCL    (MAX,ABS,ADDR) BUILTIN;
        XPTR = ADDR(XFAKE);
        I = 1;
        CALL KERNAL(AMAX); /*THE FIRST POINT IS
        SPECIAL*/
        I = 4;
        DO J=2 BY 1 TO NOPTS;
        CALL KERNAL(AMAX);/*DO COMMON PART OF FILTER*/
```

-continued

```
        CALL NEXTB; /*SHIFT PHASE AND SUBTRACT*/
        I = I+3; /*INDEX BY 3'S*/
        END;
        CALL NEXTA; /*THE LAST POINT IS SPECIAL TOO*/
        CALL NEXTB;
        RETURN; /*RETURN TO CALLER*/

TRAIN: /*AUXILIARY ENTRY POINT TO TRAIN FILTER*/
       ENTRY (XFAKE,NOPTS,OLDA,OLDERA,OLDX,DUMMY,AMAXF,
             AMAXB);
           DCL  (AMAXF,AMAXB) FIXED BINARY(15);
                XPTR = ADDR(XFAKE);
                AMAXF = 0;
                AMAXB = 0;
                I = 1; /*GO FORWARD OVER THE DATA*/
                DO J=1 BY 1 TO NOPTS;
                CALL KERNAL(AMAXF);
                I = I+3; /*INDEX BY 3'S FORWARD*/
                END;
                CALL NEXTA; /*GO TWO MORE POINTS*/
                OLDERA = OLDA;
                OLDA = A;
                CALL NEXTA;
                OLDERA = A; /*FLIP AROUND*/
                I = I-3; /*BACK UP ONE*/
                DO J=1 BY 1 TO NOPTS-1; /*GO ONE LESS,
                SPECIAL CASE*/
                OLDX = XDATA(I-3); /*SET UP FOR FIRST
                DIFFERENCE*/
                CALL KERNAL(AMAXB);
                I = I-3; /*INDEX BY 3'S BACKWARDS*/
        END;
        OLDX = XDATA(I); /*LAST (FIRST) POINT IS
        SPECIAL CASE*/
        CALL KERNAL(AMAXB); /*HANDLE LAST ONE*/
        CALL NEXTA; /*GO TWO MORE POINTS*/
        OLDERA = OLDA;
        OLDA = A;
        CALL NEXTA;
        OLDERA = A; /*FLIP AROUND*/
     RETURN; /*BACK TO CALLER*/

KERNAL: /*LOCAL ROUTINE CONTAINS MAIN BODY OF FILTER*/
     PROC(AMX);
        DCL AMX FIXED BINARY(15);
        CALL NEXTA; /*UPDATE NOISE ESTIMATE*/
        AA = 16*(A/16);/*SCALE & CLEAR OUT EXTRA LOW ORDER
        BITS*/
        F = XDATA(I) -OLDX -AA; /*COMPUTE DIFFERENCE
        SIGNAL*/
/* TEST ESTIMATE OF NOISE     */
        DCL (AA,AAA,XX) FIXED BINARY(15);
/* ASSUMES THAT RAW DATA IS 12 BIT LEFT JUSTIFIED
    IN 16 BIT WORD */
/*      THAT IS, RAW DATA IS X 16 A/D UNITS*/
        AA = ABS(A); /*CONVERT TO A/D UNITS X 8*/
        XX = F/16; /*CONVERT TO A/D UNITS X 1*/
/* THIS CODE USES 8 TIMES INTERNAL PRECISION,
        SCALING IS IMPORTANT*/
        IF      AA<8 THEN AAA = XX/128;
           ELSE IF AA<16 THEN AAA = XX/64;
             ELSE IF AA<32 THEN AAA = XX/32;
               ELSE IF AA<64 THEN AAA = XX/16;
                 ELSE IF AA<128 THEN AAA = XX/8;
                   ELSE IF AA<256 THEN AAA = XX/4;
                     ELSE IF AA<512 THEN AAA = XX/2;
                       ELSE IF AA<1024 THEN AAA = XX;
                         ELSE           AAA = XX*2;
                 NOTE: 2048 MAX, 12 BIT DATA */
/*      IF AAA=0 THEN /*HANDLE UNDERFLOWS*/
           IF F>0 THEN AAA=1;
             ELSE IF F<0 THEN AAA = -1;
        A = A + AAA; /*UPDATE GENERATOR VALUE, NOTE
                SCALING*/
/*SAVE STATUS FOR NEXT TIME */
        AMX = MAX(AMX,ABS(A)); /*SAVE PEAK VALUE*/
        OLDERA = OLDA; /*SAVE OLD NOISE VALUES*/
        OLDA = A;
        OLDX = XDATA(I); /*SAVE FOR FIRST DIFFERENCE*/
     END KERNAL;
NEXTA: /*LOCAL ROUTINE TO UPDATE SINE WAVE ESTIMATE*/
     PROC;
```

```
-continued
/*IMPLEMENTATION OF A(I) = 2*COS(DELTA)*A(I−1)
    −A(I−2)*/
/* WHERE DELTA = 360*(POWERFREQ/SAMPLINGRATE)         */
/*       AND, FOR 60 HZ AND 250 SAMPLES PER SEC,       */
/*       2*COS(DELTA) = 0.12558104                     */
          A =    OLDA/8
                +OLDA/2048
                +OLDA/16384
                +OLDA/32768;
          B =    OLDA − A + OLDERA;
          A =    A − OLDERA;
      END NEXTA;
NEXTB: /*LOCAL PROC TO SHIFT PHASE OF NOISE ESTIMATE*/
       PROC;
/* IMPLEMENTATION OF                                   */
/*       B(I−1) = (2*COS(DELTA)*A(I−1) − A(I−2)) /     
         (2−2*COS(DELTA)) */
/*       WHERE DELTA = 360*(POWERFREQ/SAMPLINGRATE)    */
/*       AND, FOR 60 HZ AND 250 SAMPLES PER SEC,       */
/*       1 / (2 − 2*COS(DELTA)) = 0.53349865           */
          B =    B/2
                +B/32
                +B/512
                +B/4096;
          B = 16*(B/16); /*SCALE AND DROP EXCESS BITS*/
          XDATA(I−3) = XDATA(I−3) − B; /*SUBSTRACT FROM
               SIGNAL*/
      END NEXTB;
END FILTER; /* END OF ENTIRE FILTER PROCEDURE          */
```

Having thus described my invention, what I claim as new, and desire to secure by Letters Patent is:

1. Digital filtering apparatus for filtering noise of a single frequency from an analog signal comprising:
   means for generating a plurality of samples of said analog signal at a given sampling rate,
   means connected to said generating means for cancelling said noise to provide at an output terminal samples from which said noise has been removed, and,
   feedback means connected between said output terminal and said means for cancelling including means connected to said output terminal for removing DC, means connected to said means for cancelling for compensating for the effect of said means for removing, a discrete sine wave generator operating at said given sampling rate electrically connected to said means of compensating, means electrically connected to sine wave generator for applying at least a minimum value of input signal to said sine wave generator, means electrically connected via said last mentioned means to said wave generator for adjusting the amplitude of said signals from said sine wave generator such that their amplitude is increased when the amplitude of the output samples of said sine wave generator is relatively large and their amplitude is decreased when the amplitude of the output samples of said sine wave generator is relatively small, said means for adjusting further including means for applying control signals to said means for adjusting to provide an output from the latter which is directly related to the absolute value of said control signals.

2. Digital filtering apparatus according to claim 1 wherein said means for generating a plurality of samples is a sample and hold circuit.

3. Digital filtering apparatus according to claim 1 wherein said means for cancelling is a differential amplifier.

4. Digital filtering apparatus according to claim 1 wherein said means for compensating is a phase shifter.

5. Digital filtering apparatus according to claim 1 wherein said means for applying at least a minimum value of output signal is a limiter.

6. Digital filtering apparatus according to claim 5 wherein said limiter has a characteristic $y=L(x)$ such that $$y=x \text{ for } x>L$$

$$y=x \text{ for } x<-L$$

$$y=L \text{ for } 0 \leq x \leq L$$

$$y=-L \text{ for } -L \leq x < 0$$

7. Digital filtering apparatus according to claim 1 wherein said means for adjusting is a programmable gain amplifier.

8. Digital filtering apparatus according to claim 7 wherein said programmable gain amplifier provides gains of 1/128, 1/64, 1/32, 1/16, 1/8, ¼, ½, 1, and 2 when said means for applying control signals provides outputs having lower and upper limits 0–8, 8–16, 16–32, 32–64, 64–128, 128–256, 256–512, 512–1024, and 1024–2048, respectively.

9. Digital filtering apparatus according to claim 1 wherein said means for applying control signals is a full wave rectifier.

10. Digital filtering apparatus according to claim 1 wherein said discrete sine wave generator includes a summing circuit to one terminal of which is connected said means for generating at least a minimum value of output signal and to the other terminal of which is connected a feedback path, first and second delay circuits connected in series with an output terminal of said summing circuit, a differential amplifier the minus terminal of which is connected to the output of said second delay circuit, a multiplier circuit connected between the output of said first delay circuit and the plus terminal of said differential amplifier, the output terminal of the latter being connected to said means for compensating and said means for applying control signals.

11. A method for filtering noise of a single frequency from an analog signal comprising the steps of:
   providing input samples of said analog signal at a given sampling rate which contain noise at at least a single frequency,
   removing DC from said input samples to provide modified input samples,
   generating discrete sine wave samples at said given sampling rate,
   adjusting the amplitude of said modified input samples containing said single frequency noise to provide other samples the amplitude of which is increased when the amplitude of the discrete sine wave sample is relatively large and the amplitude of which is decreased when the amplitude of the discrete sine wave samples is relatively small,
   generating samples having at least a minimum value when the amplitude of any of said other samples falls below a limiting value,
   applying a sample having at least a minimum value or one of said other samples to adjust the amplitude and phase of the discrete sine wave samples,
   compensating for the effects of the step of removing DC to provide discrete sine wave samples which have been further shifted in phase, and,
   cancelling said noise at said single frequency from each of the plurality of input samples by subtracting said further phase shifted discrete sine wave sample from an input sample.

12. A method according to claim 11 further including the step of generating from said discrete sine wave output samples control samples which modify the output samples so they are directly related to the absolute value of said control samples.

13. A method according to claim 12 wherein the step of generating input samples includes the step of digitizing each of said input samples.

14. A method according to claim 12 wherein the step of removing DC includes the step of delaying each input sample for one sampling interval and computing samples of the first difference by subtracting the delayed value of the previous input sample from the value of each current input sample.

15. A method according to claim 12 wherein the step of generating discrete sine wave samples includes the step of calculating a present sine wave sample based on the values of two previously stored samples ($y_{i-1}$, $y_{i-2}$) and two previous update values ($L(x_{i-1})$, $L(x_{i-2})$) in accordance with the equation:

$$y_i = K \cdot [y_{i-1} + L(x_{i-1})] - [y_{i-2} + L(x_{i-2})]$$

where $K = 2 \cos(2\pi FT)$.

16. A method according to claim 12 wherein the step of adjusting the amplitude of said samples containing said single frequency noise includes the steps of multiplying or dividing said samples containing said single frequency noise by fixed digital values as a function of the value of a control input as follows: when said control inputs are between 0–8, 8–16, 16–32, 32–64, 64–128, 128–256, 256–512, 512–1024 and 1024–2048 then divide by 128, 64, 32, 16, 8, 4, 2, or multiply by 1 and 2, respectively.

17. A method according to claim 12 wherein the step of generating samples having at least a minimum value include the steps of comparing the value of a sample with a stored value and providing an output sample in accordance with the relationship $y = L(x)$ such that $$Y = \begin{cases} x & \text{for } x > L \\ x & \text{for } x < -L \\ L & \text{for } 0 \leq x \leq L \\ -L & \text{for } -L \leq x \leq 0 \end{cases}$$

18. A method according to claim 12 wherein the step of compensating for the effects of the step of removing includes the steps of accepting a discrete sine wave sample, introducing a delay of one sampling interval, computing a first sum by adding the current discrete sine wave sample to the delayed value of the summation of all previous discrete sine wave samples.

19. A method according to claim 12 wherein the step of generating from said discrete sine wave output samples control samples includes the step of converting discrete sine wave output values having positive and negative values to positive values.

* * * * *